(12) United States Patent
Wei

(10) Patent No.: US 7,575,990 B2
(45) Date of Patent: Aug. 18, 2009

(54) METHOD OF FORMING SELF-ALIGNED CONTACTS AND LOCAL INTERCONNECTS

(75) Inventor: An Chyi Wei, Hsinchu (TW)

(73) Assignee: Macronix International Co., Ltd. (TW)

( * ) Notice: Subject to any disclaimer, the term of this patent is extended or adjusted under 35 U.S.C. 154(b) by 194 days.

(21) Appl. No.: 11/174,147

(22) Filed: Jul. 1, 2005

(65) Prior Publication Data

US 2007/0004187 A1    Jan. 4, 2007

(51) Int. Cl.
*H01L 21/3205* (2006.01)
(52) U.S. Cl. .................. 438/586; 438/597
(58) Field of Classification Search .......... 438/586, 438/597, 700; 257/382
See application file for complete search history.

(56) References Cited

U.S. PATENT DOCUMENTS

| 5,668,065 | A  | 9/1997 | Lin |
| 6,271,087 | B1 | 8/2001 | Kinoshita et al. |

2007/0004187 A1 * 1/2007 Wei ............................ 438/586

* cited by examiner

*Primary Examiner*—Mark Prenty
(74) *Attorney, Agent, or Firm*—Baker & McKenzie LLP

(57) ABSTRACT

A method of forming a plurality of self-aligned contacts of a core region and local interconnect openings of a peripheral region of a semiconductor device is disclosed. A plurality of gate-structures are formed on the core and peripheral regions of a semiconductor substrate. Sidewall spacers then are formed around the gate structures. A liner layer and a dielectric layer are sequentially formed on the semiconductor substrate. Then a photoresist pattern is formed to define a plurality of self-aligned contacts of said core region and local interconnect openings of the peripheral region, and the dielectric layer, liner layer and sidewall spacers are etched to form a plurality of self-aligned contacts of the core region and local interconnect contacts of the peripheral region. This is achieved by an etching step having a high selectivity with respect to the dielectric layer and sidewall spacers.

26 Claims, 6 Drawing Sheets

METHOD OF FORMING SELF-ALIGNED CONTACTS AND LOCAL INTERCONNECTS

BACKGROUND OF THE INVENTION

1. Field of the Invention

The present invention relates to a method of fabricating semiconductor devices, and more particularly to forming self-aligned contacts and local interconnects of semiconductor devices.

2. Description of the Related Art

In recent years, the size of integrated circuit devices continues to decrease resulting in considerable increase of the packing densities for these devices. The performance of the integrated circuit devices also improves as a result while the manufacture costs have gone down as well.

However, the performance of denser integrated circuit devices could drop when smaller process parameters are used. Accordingly, the issue of maintaining or controlling the precision of contact windows is particularly important as the density of integrated circuit devices continues to increase for future generations of these devices. This etching control issue is even more critical for integrated circuit devices with multiple polysilicon layers. Therefore, a so-called self-aligned contact (SAC) process which can reduce contact area is developed to deal with this issue.

Various SAC processes exist today. For example, U.S. Pat. No. 6,271,081 to Kinoshita et al. (the entire disclosure of which is herein incorporated by reference) provides a method of forming self-aligned contacts and local interconnects using self-aligned local interconnects. Referring now more particularly to FIGS. 1A-1D, there are illustrated the cross sectional views of the SAC process disclosed by Kinoshita et al. The figures show a portion of the core region 104 and also a portion of the peripheral region 106 in which an IC device such as a flash memory is built. FIG. 1A shows a portion of apartially completed dual gate flash memory device after a dielectric layer is deposited according to the prior art. The multi-layer stacked gate structure 110 of the core region 104 is formed on a semiconductor substrate 102. The multi-layer stacked gate structure 110 comprises a gate dielectric layer 112 of a material such as an oxide or nitride, a floating gate layer 114, an interpoly dielectric layer 116, a control gate layer 118, a gate silicide layer 120, and a cap dielectric layer 122. In the peripheral region 106, the multi-layer stacked gate structure only comprises a gate dielectric layer 112, a polysilicon gate layer 118, a gate silicide layer 120, and a cap dielectric layer 122. Sidewall spacers 130 and a liner layer 131 are formed on the sidewalls of the multi-layer stacked gate structure to protect the structure from over etching and short circuit. A common source 142 is formed between two multi-layer stacked gate structures and drains 144 are also formed in the semiconductor substrate 102 and spaced apart from the common source by channel regions 146. In order to decrease the contact resistance and thus to increase the operational speed of the IC device, source/drain silicides 129 are formed. Thereafter, a dielectric layer 132 is formed over the entire semiconductor substrate surface.

FIG. 1B shows the simultaneously forming of the source/drain contact 162 and interconnect contact opening 163 by using a photoresist pattern 166 as a mask. Then, FIG. 1C shows the reopening of the interconnect contact 165 alone by using a second photoresist pattern 168 as a mask to remove a portion of the cap dielectric layer 122 and expose the polysilicon gate layer 118 in the peripheral region 106. After the removal of the second photoresist mask, FIG. 1D shows a metal layer being deposited and planarized to complete the formation of both the SAC contact 170 and the interconnect contact 171.

From the above description, one of ordinary skills in the art can readily see that a lot of photolithography and etching steps are needed to complete the formation of both the SAC contact and the interconnect contact for a semiconductor device. These additional steps significantly increase the complexity and cost for mass-production.

Another SAC process has been proposed to address this issue by opening both the SAC contact and the interconnect contact at the same time. For example, U.S. Pat. No. 5,668,065 to Chen-Hsi Lin (the entire disclosure of which is herein incorporated by reference) provides a method of simultaneously forming silicide-based self-aligned contacts and local interconnects. Referring now more particularly to FIGS. 2A-2C, there are illustrated the cross sectional views of the SAC process disclosed by Lin. The figures show a portion of the core region and also a portion of the peripheral region in which a MOSFET IC device is built. FIG. 2A shows a first photoresist pattern 244 formed to define source/drain contacts and interconnect contacts. The gates 220 of the IC device are formed on a semiconductor substrate 210. The gate structure comprises a gate dielectric layer 222, a polysilicon gate layer 224, a tungsten silicide layer 226, and a cap dielectric layer 228. Sidewall spacers 230 and a liner layer 232 such as a thin oxide layer are formed on the sidewalls of the gate structure to protect the structure from over etching and short circuit. A common source 214 is formed between two gate structures, and drains 212 are also formed in the semiconductor substrate and spaced apart from the common source by channel regions. The liner layer 232 is also formed over a field oxide isolation region 216. Thereafter, the source/drain SAC contact opening and interconnect contact opening are simultaneously formed using a photoresist pattern 234 as a mask.

FIG. 2B shows a cross-sectional view of the IC substrate in which an amorphous silicon layer 240 is formed and etched by using a second photoresist pattern 244 as a mask to remove the exposed portion of the amorphous layer and liner layer. After the second photoresist pattern is removed, FIG. 2C shows the forming of a silicide layer 250 in both the source/drain SAC contact 252 and the interconnect contact.

However, this approach can not be used in a high speed operation device if interlayer dielectric (ILD) thickness difference occurs between the core region and the peripheral region as described in FIG. 1D. Therefore, there is still a need for a process which can effectively solve the above-mentioned problems of the prior art.

SUMMARY OF THE INVENTION

The present invention is directed to solve these and other disadvantages of the prior art. A method of forming self-aligned contacts of a core region and local interconnects of a course region of a peripheral region of a semiconductor device is disclosed. This is achieved by the etching step having high selectivity with respect to a dielectric layer and sidewall spacers of the semiconductor device.

One aspect of the present invention contemplates an etching method of forming self-aligned contacts of a core region and local interconnects of a peripheral region of an integrated circuit. The method comprises the steps of a first etching to break through a cap dielectric layer, a main etching to etch a dielectric layer, an over etching to etch a dielectric layer with a higher selectivity to a sidewall spacer layer, an oxygen flushing to remove polymer residues generated in the previous steps, and a through etching to etch through a liner layer.

The main etching and over etching both have a high selectivity with respect to the dielectric layer and sidewall spacer layer.

Another aspect of the present invention provides a method of fabricating a semiconductor device on a semiconductor substrate. The method comprises the steps of forming a plurality of gate-structures on the semiconductor substrate, forming sidewall spacers around the gate structures, forming a liner layer on the semiconductor substrate, forming a dielectric layer on the semiconductor substrate, forming a photoresist pattern to define a plurality of self-aligned contacts of the core region and local interconnects of the peripheral region, and etching the dielectric layer, liner layer and sidewall spacers to form a plurality of self-aligned contacts of the core region and local interconnect contacts of the peripheral region. The etching has a high selectivity with respect to the dielectric layer and sidewall spacers.

Yet another aspect of the present invention provides a method of fabricating a semiconductor device on a semiconductor substrate. The method comprises the steps of forming sidewall spacers around a plurality of gate-structures on the semiconductor substrate, forming a liner layer and a dielectric layer on the semiconductor substrate, and etching the dielectric layer, liner layer and sidewall spacers to form a plurality of self-aligned contacts of a core region and local interconnects of a peripheral region. The etching has a high selectivity with respect to the dielectric layer and sidewall spacers.

BRIEF DESCRIPTION OF THE DRAWINGS

The accompanying drawings are included to provide a further understanding of the present invention, and are incorporated in and constitute a part of the description to this invention. The drawings illustrate embodiments of the present invention, and together with the description, serve to explain the principles of the present invention. There is shown.

DESCRIPTION OF THE PREFERRED EMBODIMENTS

Figure 1A:
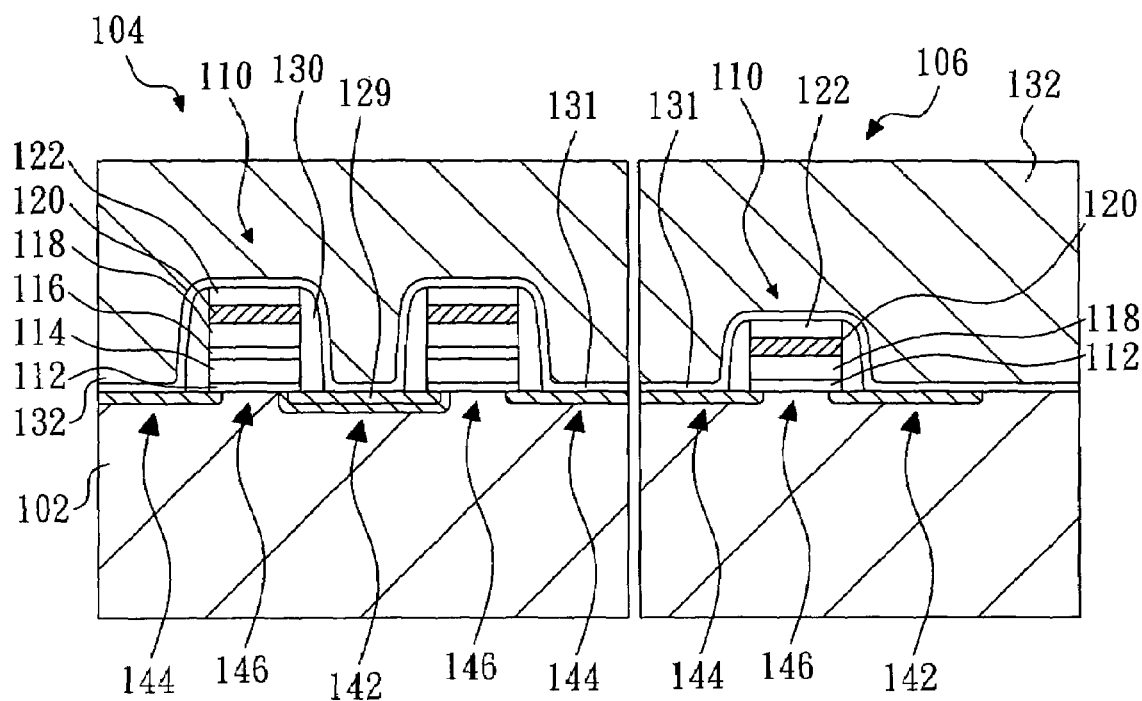
FIG. 1A illustrates a portion of a partially completed dual gate flash memory device after a dielectric layer is deposited according to the prior art.
Figure 1B:
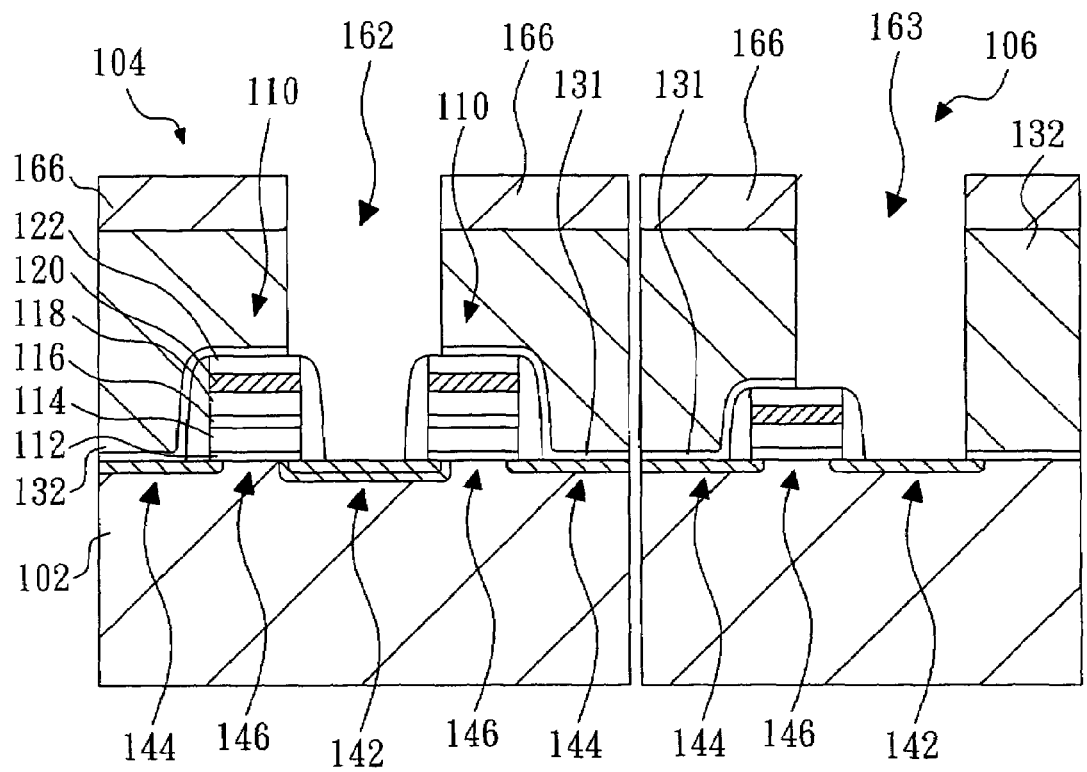
FIG. 1B illustrates the simultaneous forming of the source/drain contact and interconnect contact by using a photoresist pattern as a mask according to the prior art.
Figure 1C:
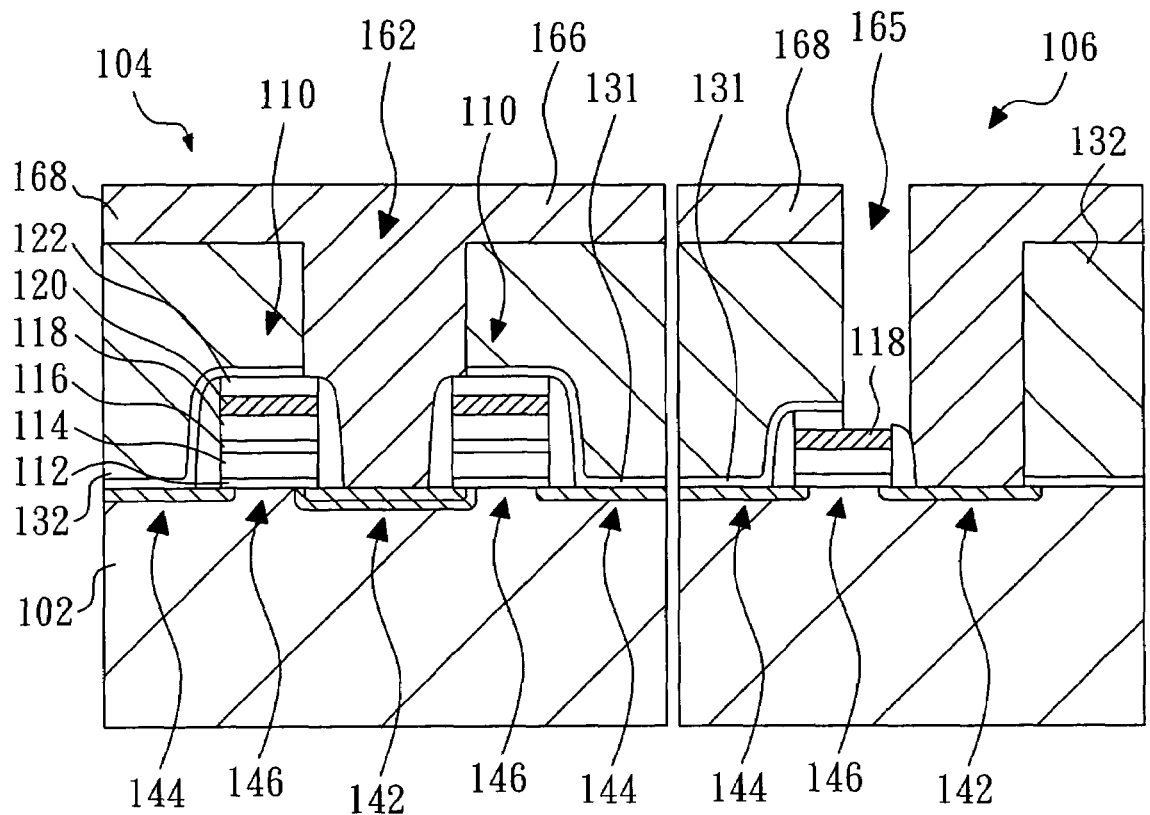
FIG. 1C illustrates the forming only the interconnect contact by using a second photoresist pattern as a mask in the peripheral region according to the prior art.
Figure 1D:
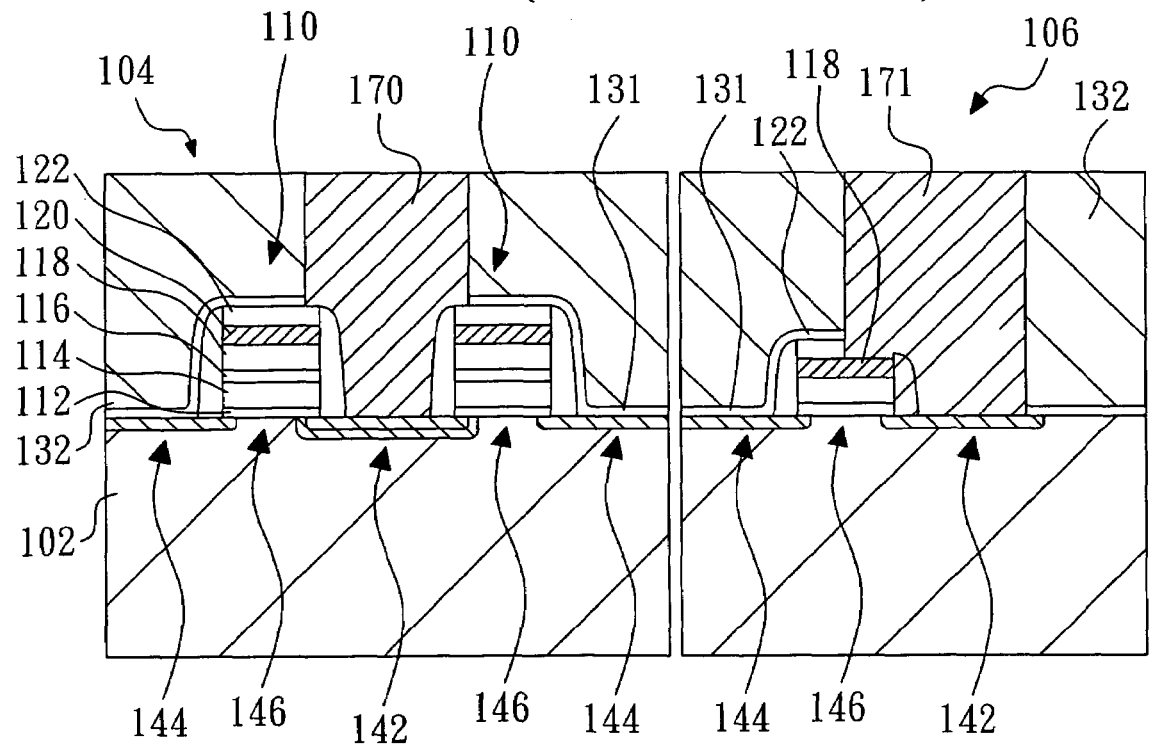
FIG. 1D illustrates a metal layer being deposited and planarized to complete the formation of both the SAC contact and the interconnect contact according to the prior art.
Figure 2A:
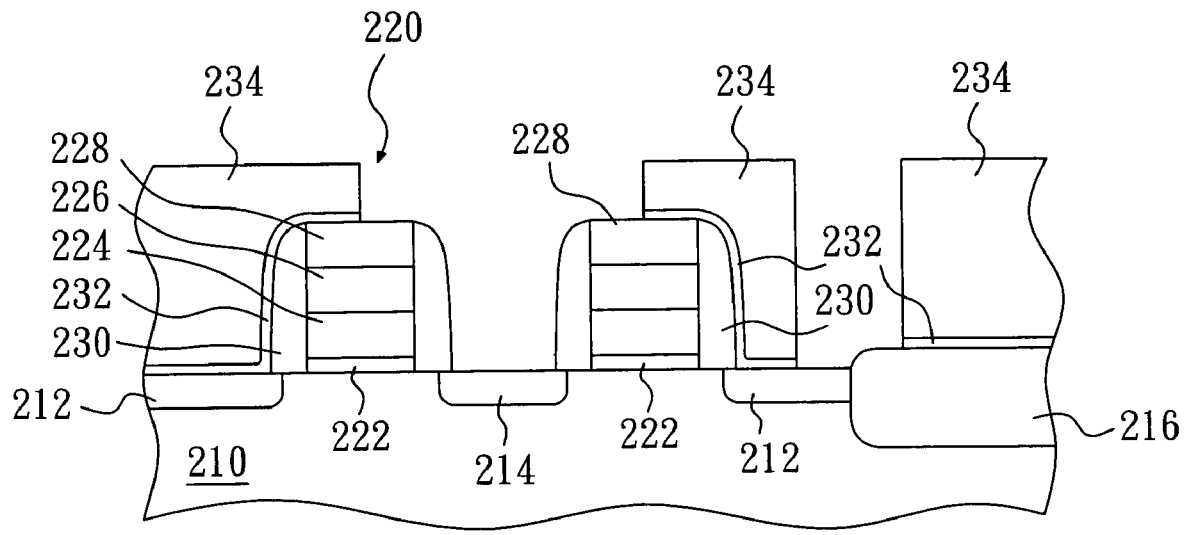
FIG. 2A illustrates a portion of a partially completed memory device after a first photoresist pattern is formed to define source/drain contacts and interconnect contacts according to the prior art.
Figure 2B:
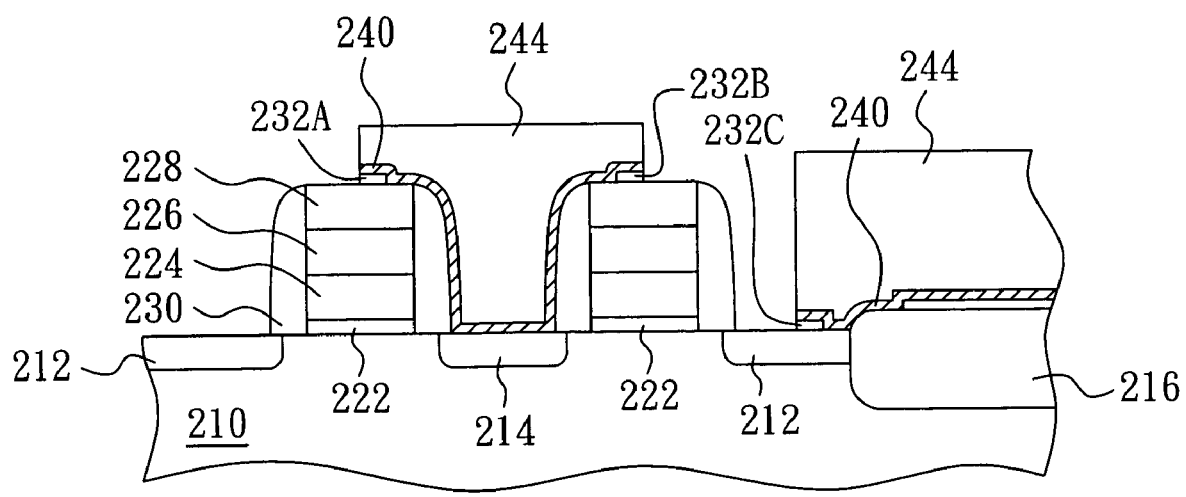
FIG. 2B illustrates a cross-sectional view of the IC substrate in which an amorphous silicon layer is formed and etched by using a second photoresist pattern as a mask according to the prior art.
Figure 2C:
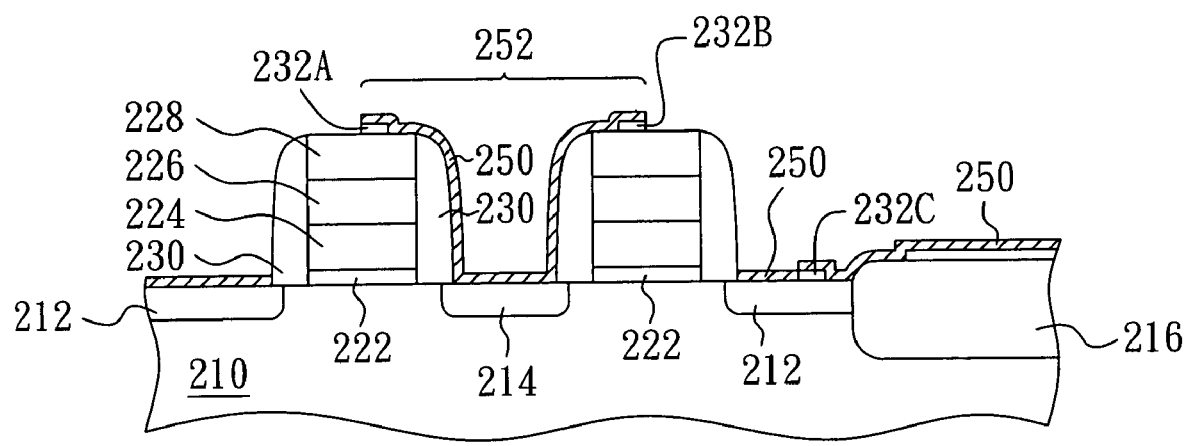
FIG. 2C illustrates the forming of a silicide layer in both source/drain SAC contact and the interconnect areas according to the prior art.

The invention disclosed herein is directed to a fabricating process flow for forming self-aligned contacts and local interconnects of a semiconductor device. The drawing figures illustrate a partially completed flash memory device as an examplarary application of the present invention. In the following description, numerous details are set forth in order to provide a thorough understanding of the present invention. It will be appreciated by one skilled in the art that variations of these specific details are possible while still achieving the results of the present invention. In other instances, well-known processing steps are not described in detail in order not to unnecessarily obscure the present invention.

Figure 3A:
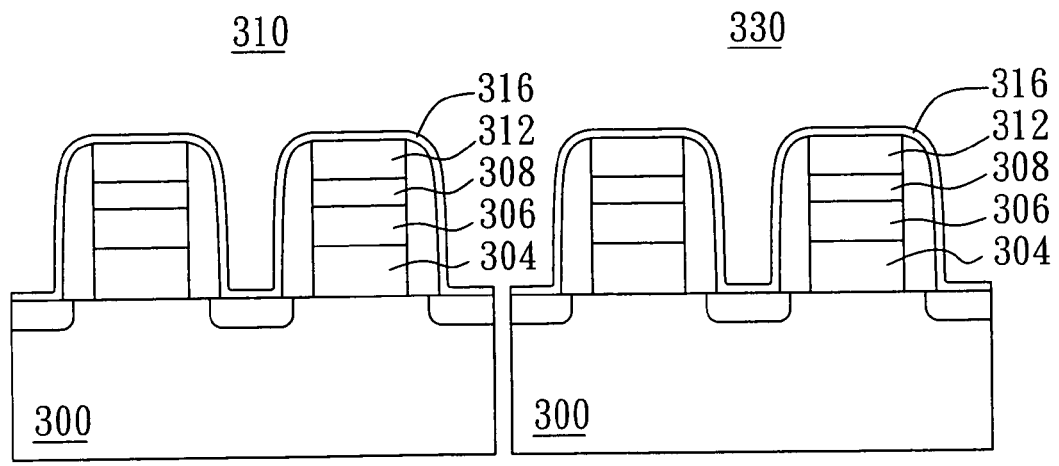
FIG. 3A illustrates a portion of a partially completed semiconductor device according to an embodiment of the present invention.

Referring now more particularly to FIG. 3A, there is shown a portion of a partially completed semiconductor device according to an embodiment of the present invention. The figures show a portion of a core region 310 and also a portion of a peripheral region 330 in which the semiconductor device is built.

First, a multi-layer stacked gate structure of the core region 310 and also of the peripheral region 330 is simultaneously formed on a semiconductor substrate 300. The formation of the multi-layer stacked gate structure comprises growing a gate dielectric layer (not shown), and sequentially depositing a floating gate layer 304, an interpoly dielectric layer (not shown), a control gate layer 306, a gate silicide layer 308, and a cap dielectric layer 312. Thereafter, the multi-layer stacked gate structure is patterned by conventional photolithography and etching techniques.

In one embodiment, the semiconductor device is a non-volatile memory such as a flash, EPROM, or EEPROM. However, other types of memory devices or logic devices can also work by utilizing the process disclosed by the present invention. The gate dielectric layer is a thin layer of oxide with a thickness between 50 to 100 angstroms. The floating gate layer 304 is typically a polysilicon layer formed by the conventional chemical vapor deposition (CVD) process. The interpoly dielectric layer is a thin layer of oxide-nitride-oxide (ONO). The control gate layer 306 is another CVD formed polysilicon layer. The gate silicide layer 308 is typically a layer of tungsten silicide (WSi). And the cap dielectric layer 312 is a layer of silicon nitride ($Si_3N_4$) with a thickness between 1000 to 2000 angstroms.

Next, spacers 314 are formed on the sidewalls of the gates, and a thin liner layer 316 is also formed over the entire semiconductor substrate 300. Then, source/drain regions 318 are formed to complete the multi-layer stacked gate structure as shown in FIG. 3A.

In one embodiment, the sidewall spacers 314 are typically made of silicon nitride (SiN) and anisotropically etched by the conventional technique. The source/drain regions 318 which are typically formed by ion implantation technique, are preferably doped with arsenic ($As^{75}$) or phosphorus ($P^{31}$) impurities, with an implantation dose of about 2E15 to 5E16 $cm^{-2}$, and an implantation energy of 30 to 80 KeV. Lightly doped drain (LDD) region can be formed to improve the operational speed of the IC. The liner layer 316 also uses silicon nitride ($SiN_x$) formed by the LPCVD technique with a thickness between 100 to 200 angstroms as an etch stop layer of the self-aligned contact (SAC) process.

Figure 3B:
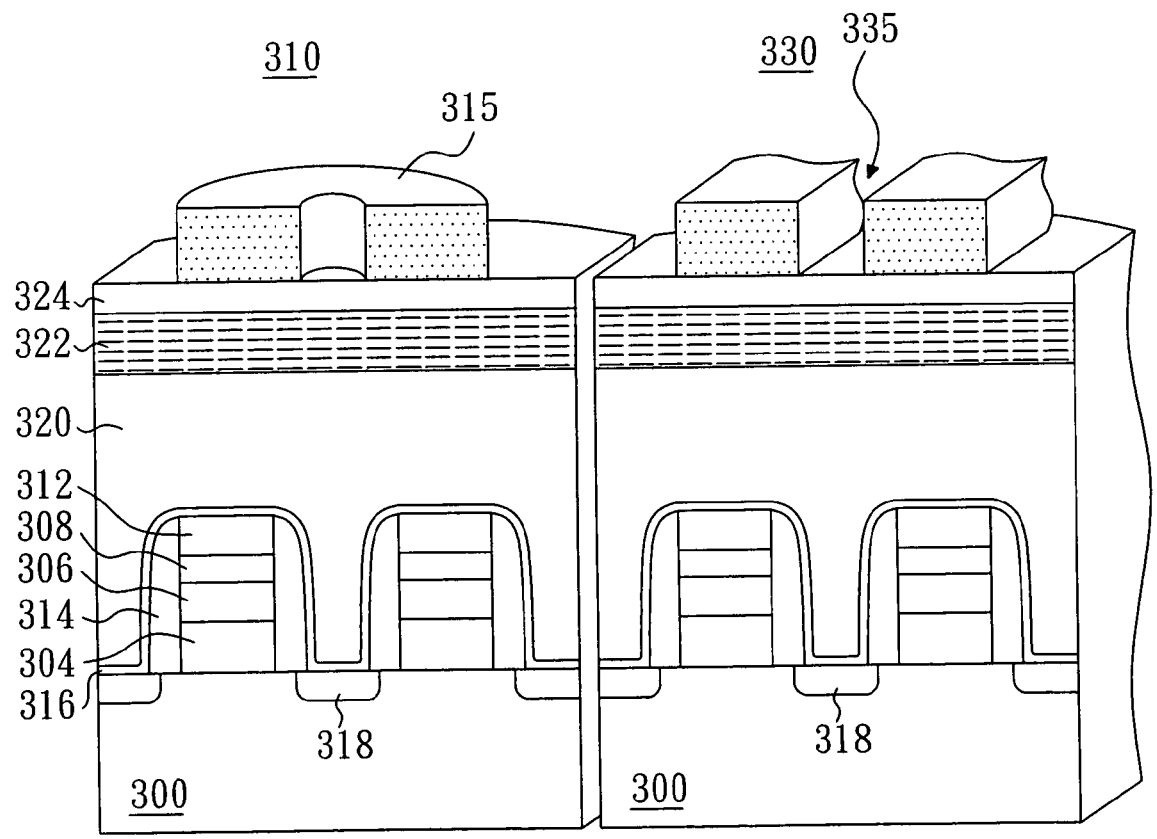
FIG. 3B illustrates a portion of a partially completed semiconductor device after self-aligned contact and local interconnect opening photoresist patterns are formed according to an embodiment of the present invention.

Referring now more particularly to FIG. 3B, there is shown a portion of a partially completed semiconductor device after a self-aligned contact and a local interconnect opening photoresist patterns are formed according to an embodiment of the present invention. A dielectric layer is first formed over the entire semiconductor substrate. Thereafter, self-aligned contact and local interconnect opening photoresist patterns are formed.

In one embodiment, the dielectric layer comprises three dielectric layers of a boronphosphosilicate glass (BPSG) 320, tetra-ethyl-ortho silicate (TEOS) 322 and silicon oxynitride (SiON) cap layer 324 from bottom to top as shown in FIG. 3B. The BPSG layer 320 is usually formed by an atmosphere CVD (APCVD) technique with a thickness of about 3000 to 8000 angstroms. The TEOS layer 320 is usually formed by a plasma CVD (PECVD) technique with a thickness of about 1000 to 3000 angstroms. The silicon oxynitride (SiON) cap layer 324 is usually used as an anti-reflection coating (ARC) layer with a thickness of about 500 to 1000 angstroms. However, a single dielectric layer or a double dielectric layers can also work. The SAC contact opening 315 and local interconnect contact opening 335 photoresist pattern are formed by the conventional photolithography technique.

Figure 3C:
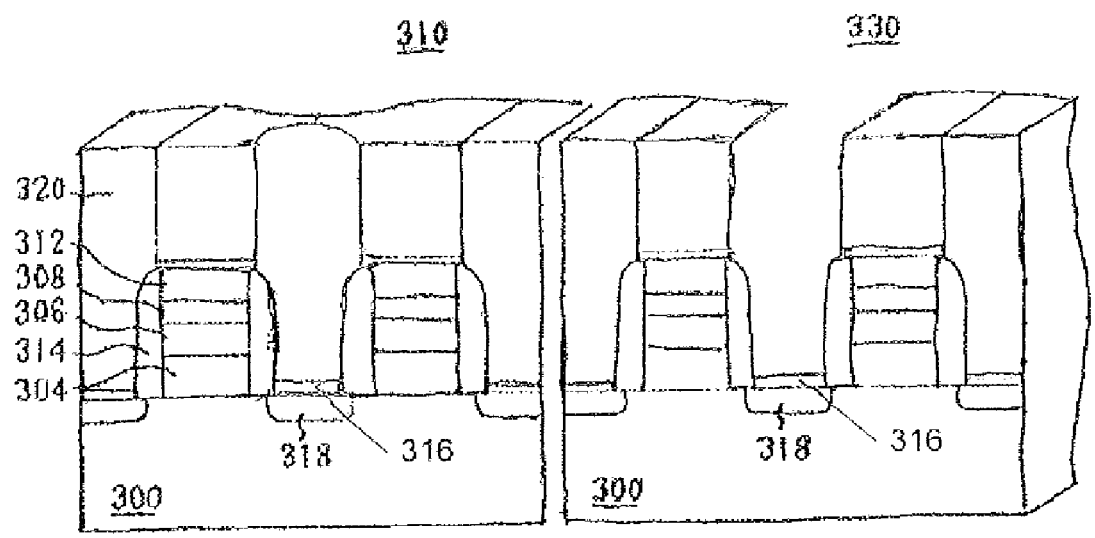
FIG. 3C illustrates a portion of a partially completed semiconductor device after initial etching steps are performed to form a self-aligned contact and local interconnect openings according to an embodiment of the present invention.

Referring now to FIG. 3C, there is shown a portion of a partially completed semiconductor device after a self-aligned contact and a local interconnect are formed according to an embodiment of the present invention.

Figure 3D:
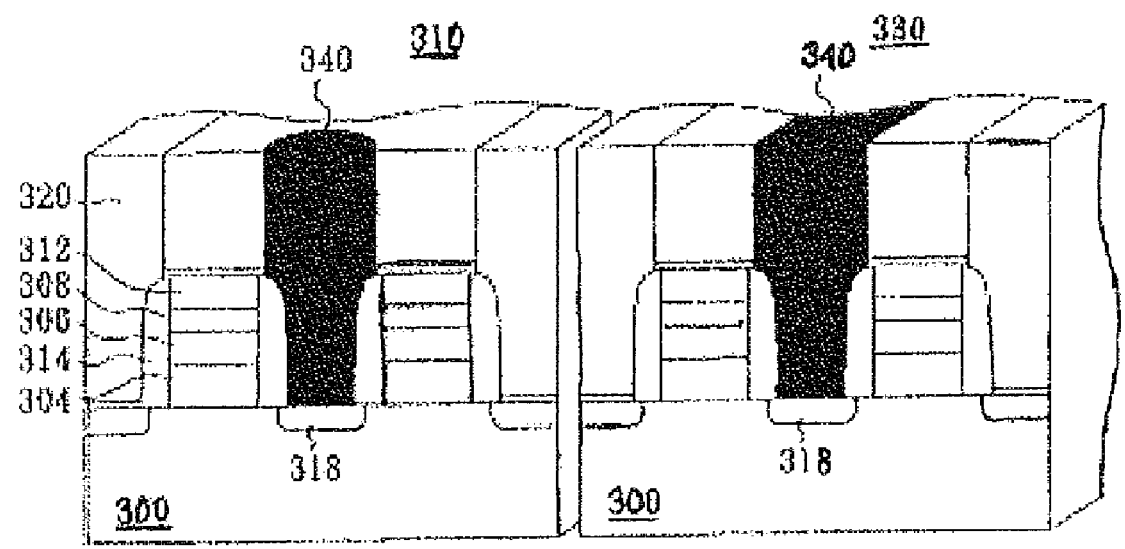
FIG. 3D illustrates a portion of a partially completed semiconductor device after self-aligned contact and local interconnect openings are formed according to an embodiment of the present invention.

This etching step is one of the key points of the present invention. The self-aligned contact and local interconnect opening are formed by the etching recipe of the present invention. In one embodiment, the etching is achieved by a five step etching recipe disclosed herein. The first step is etching the silicon oxynitride (SiON) cap layer 324 and the TEOS layer 322. The etching recipe uses a source power of 800 watts, a bias power of 400 watts, and the etchant comprises $CF_4$ at a flow rate of 60 sccm, Ar at a flow rate of 270 sccm, and $O_2$ at a flow rate of 10 sccm, all for 40 seconds. The second step is a main step comprising etching the BPSG layer 320 and stopping at approximately the level of the shoulder of the sidewall spacers 314. The etching recipe which has a higher selectivity of BPSG to SiN uses a source power of 1400 watts, a bias power of 1100 watts, and the etchant comprises $C_4F_6$ at a flow rate of between 10 to 13 sccm, Ar at a flow rate of between 200 to 300 sccm, and $O_2$ at a flow rate of 10 sccm, all for 45 seconds. Most preferably, the etchant comprises $C_4F_6$ at a flow rate of 10 sccm, and Ar at a flow rate of 300 sccm. The third step is an over etch step which etches the remaining BPSG layer 320 and the $SiN_x$ liner layer 316 on the sidewall spacers 314 and stops on the SiN sidewall spacers 314 and the liner layer 316 at the bottom area of the trench and hole. The etching recipe uses a source power of 1400 watts, a bias power of 1100 watts, and the etchant comprises $C_4F_6$ at a flow rate of between 10 to 13 sccm, Ar at a flow rate of between 200 to 300 sccm, and $O_2$ at a flow rate of 10 sccm, all for 60 seconds. Most preferably, the etchant comprises $C_4F_6$ at a flow rate of 11 sccm, Ar at a flow rate of 300 sccm. The fourth step is an $O_2$ flush step which removes the polymer residue at the bottom of the openings. The etching recipe uses a source power of 400 watts, a bias power of 200 watts, and the etchant comprises Ar at a flow rate of 250 sccm, and $O_2$ at a flow rate of 10 sccm, both for 10 seconds. Finally, as illustrated in FIG. 3D, the fifth step is a through etch step which etches through the remaining $SiN_x$ liner layer 316 at the bottom of the trench and hole. The etching recipe uses a source power of 300 watts, a bias power of 100 watts, and the etchant comprises Ar at a flow rate of 850 sccm, $CH_3F$ at a flow rate of 50 sccm, and $O_2$ at a flow rate of 300 sccm, all for 40 seconds. According to the present invention, the etching rate in the core (hole) region is about 8000 angstroms/minute, and the etching rate in the peripheral (trench) region is about 7900 angstroms/minute.

In this way, the etching rates are substantially the same in both the core (hole) and peripheral (trench) regions. Therefore, the self-aligned contacts and local interconnect openings can be formed without the problems of the prior arts.

Referring again to FIG. 3D, after the self-aligned contact and local interconnect opening are formed according to an embodiment of the present invention, the photoresist pattern is removed by the conventional stripping technology. The self-aligned contact and local interconnect opening are then filled by a conductive metal layer 340 and are planarized. The fabricating method of forming self-aligned contacts and local interconnects according to the present invention thus achieves its goal of reducing masking and etching steps While the invention has been particularly shown and described with reference to a preferred embodiment, it will be understood by those skilled in the art that various changes in form and details may be made therein without departing from the spirit and scope of the present invention.

What is claimed is:

1. An etching method of forming a self-aligned contact of a core region and a local interconnect of a peripheral region of an integrated circuit, comprising the steps of:
    performing a first etching to break through a cap dielectric layer;
    performing a main etching to etch a dielectric layer to form a hole in the core region and a trench in the peripheral region;
    performing an over etching to etch a silicon nitride (SiN) liner layer on the shoulder of sidewall spacers associated with the hole and with the trench without etching the SiN liner layer at the bottom area of the hole and the trench;
    performing an oxygen flushing to remove polymer residues; and
    performing a through etching to etch through the SiN liner layer that lines the bottom area of the hole and the trench, wherein said main etching and over etching have a high selectivity with respect to said dielectric layer and said sidewall spacers.

2. The method of claim 1, wherein said cap dielectric layer comprises a silicon oxynitride (SiON) and a tetra-ethyl-ortho silicate (TEOS).

3. The method of claim 1, wherein said dielectric layer is a boronphosphosilicate glass (BPSG).

4. The method of claim 1, wherein said sidewall spacer layer comprises a silicon nitride (SiN).

5. The method of claim 1, wherein said main etching uses an etchant comprising Ar, $C_4F_6$, and $O_2$.

6. The method of claim 5, wherein said main etching uses an etchant comprising Ar at a flow rate between 200 to 300 sccm, and $C_4F_6$ at a flow rate between 10 to 13 sccm.

7. The method of claim 1, wherein said over etching uses an etchant comprising Ar, $C_4F_6$, and $O_2$.

8. The method of claim 7, wherein said over etching uses an etchant comprises Ar at a flow rate between 200 to 300 sccm, and $C_4F_6$ at a flow rate between 10 to 13 sccm.

9. A method of fabricating a semiconductor device on a semiconductor substrate, comprising the steps of:
    forming at least one gate structure in a core region and a peripheral region on said semiconductor substrate;
    forming sidewall spacers around said gate structures;

forming a silicon nitride (SiN) liner layer on said semiconductor substrate;

forming a dielectric layer on said semiconductor substrate;

forming a photoresist pattern to define a hole associated with at least one self-aligned contact of said core region and a trench associated with a local interconnect opening of said peripheral region; and etching said dielectric layer, and said SiN liner layer and sidewall spacers before etching the portion of said SiN liner layer that lines the bottom area of the hole and the trench to form at least one self-aligned, contact of said core region and local interconnect opening of said peripheral region; wherein said etching has a high selectivity with respect to said dielectric layer and said sidewall spacers.

10. The method of claim 9, wherein said semiconductor device is a non-volatile memory.

11. The method of claim 10, wherein said non-volatile memory is a flash memory.

12. The method of claim 10, wherein said gate-structure is a multi-layered gate structure.

13. The method of claim 9, wherein said dielectric layer comprises a silicon oxynitride (SiON), a tetra-ethyl-ortho silicate (TEOS), and a boronphosphosilicate glass (BPSG).

14. The method of claim 9, wherein said sidewall spacer layer comprises a silicon nitride (SiN).

15. The method of claim 9, wherein said etching uses an etchant comprising Ar, $C_4F_6$, and $O_2$.

16. The method of claim 15, wherein said etching uses an etchant comprising Ar at a flow rate between 200 to 300 sccm, and $C_4F_6$ at a flow rate between 10 to 13 sccm both for about 45 seconds.

17. The method of claim 16, wherein said etching further uses an etchant comprising Ar at a flow rate between 200 to 300 sccm, and $C_4F_6$ at a flow rate between 10 to 13 sccm both for about 60 seconds.

18. A method of fabricating a semiconductor device on a semiconductor substrate, comprising the steps of:

forming sidewall spacers around a gate-structure on said semiconductor substrate in a core region and around a gate-structure in a peripheral region on said semiconductor substrate, thereby forming a hole and a trench respectively;

forming a silicon nitride (SiN) liner layer and a dielectric layer on said substrate; and etching said dielectric layer, and said SiN liner layer on the sidewall spacers before etching a portion of said SiN liner layer that lines the bottom area of the hole and the trench to simultaneously form a self-aligned contact of a core region and a local interconnect opening of a peripheral region; wherein said etching has a high selectivity with respect to said dielectric layer and said sidewall spacers.

19. The method of claim 18, wherein said semiconductor device is a non-volatile memory.

20. The method of claim 19, wherein said non-volatile memory is a flash memory.

21. The method of claim 19, wherein said gate-structure is a multi-layered gate structure.

22. The method of claim 18, wherein said dielectric layer comprises a silicon oxynitride (SiON), a tetra-ethyl-ortho silicate (TEOS), and a boronphosphosilicate glass (BPSG).

23. The method of claim 18, wherein said sidewall spacer layer comprises a silicon nitride (SiN).

24. The method of claim 18, wherein said etching uses an etchant comprising Ar, $C_4F_6$, and $O_2$.

25. The method of claim 24, wherein said etching uses an etchant comprising Ar at a flow rate between 200 to 300 sccm, and $C_4F_6$ at a flow rate between 10 to 13 sccm both for about 45 seconds.

26. The method of claim 25, wherein said etching further uses an etchant comprising Ar at a flow rate between 200 to 300 sccm, and $C_4F_6$ at a flow rate between 10 to 13 sccm both for about 60 seconds.

* * * * *